United States Patent
Sze

[19]

[11] Patent Number: 6,130,121
[45] Date of Patent: Oct. 10, 2000

[54] METHOD FOR FABRICATING A TRANSISTOR

[75] Inventor: Jhy-Jyi Sze, Tainan, Taiwan

[73] Assignee: United Semiconductor Corp., Hsinchu, Taiwan

[21] Appl. No.: 09/206,111

[22] Filed: Dec. 4, 1998

[30] Foreign Application Priority Data

Oct. 19, 1998 [TW] Taiwan ................................. 87117232

[51] Int. Cl.[7] ................................................. H01L 21/338
[52] U.S. Cl. ............................................ 438/167; 438/183
[58] Field of Search .................................. 438/307, 302, 438/299, 595, 231, 183, 233, 167, 289, 181, 426

[56] References Cited

U.S. PATENT DOCUMENTS

| | | | |
|---|---|---|---|
| 4,694,564 | 9/1987 | Enoki et al. ........................... | 437/40 |
| 4,808,545 | 2/1989 | Balasubramanyam et al. .......... | 437/41 |
| 5,858,843 | 1/1999 | Doyle et al. ........................... | 438/299 |
| 5,897,349 | 4/1999 | Agnello ................................. | 438/230 |
| 5,998,285 | 12/1999 | Chou .................................... | 438/585 |
| 6,051,486 | 4/2000 | Gardner ................................ | 438/585 |

*Primary Examiner*—Richard Booth
*Assistant Examiner*—Walter L. Lindsay, Jr.
*Attorney, Agent, or Firm*—Jiawei Huang; J. C.Patents

[57] ABSTRACT

A method for fabricating a transistor with a borderless contact is provided. The method contains forming several dummy gates on a substrate. Each dummy gate includes a pad oxide layer and a dummy gate layer. A doped polysilicon layer is formed on the substrate at each side of the dummy gates. A shallow trench isolation (STI) is formed to define active regions. A horizontal gate opening is formed to expose two adjacent dummy gates. The dummy gate layer is removed to expose sidewalls of the doped polysilicon. Spacers are formed on the exposed sidewalls of the doped polysilicon layer. A threshold voltage doped region and an anti-punch-through doped region are formed in the substrate by ion implantation, using the doped polysilicon layer and the spacers as a mask. The exposed pas oxide layer is removed and a gate oxide layer is formed instead. A gate metal layer is formed on the gate oxide layer between the spacers, in which the horizontal gate opening is also filled. A passivation layer is formed over the substrate and is planarized to expose the doped polysilicon layer. A dielectric layer is formed over the substrate. A borderless contact opening is formed in the dielectric layer to expose the doped polysilicon and may expose the passivation layer on the STI.

20 Claims, 9 Drawing Sheets

METHOD FOR FABRICATING A TRANSISTOR

CROSS-REFERENCE TO RELATED APPLICATION

This application claims the priority benefit of Taiwan application serial no. 87117232, filed Oct. 19, 1998, the full disclosure of which is incorporated herein by reference.

BACKGROUND OF THE INVENTION

1. Field of the Invention

This invention relates to semiconductor fabrication, and more particularly to a method for fabricating a transistor with a borderless contact.

2. Description of Related Art

As device dimension is greatly reduced, a metal-oxide semiconductor (MOS) transistor dimension is also accordingly reduced. The highly reduced MOS transistor therefore has insufficient junction area for a formation of a landed contact. A strategy of unlanded contact is then widely taken in the current semiconductor fabrication. The unlanded contact is also called a borderless contact, which allows a contact to be formed without fully landing on the junction area of the MOS transistor.

Figure 1A:
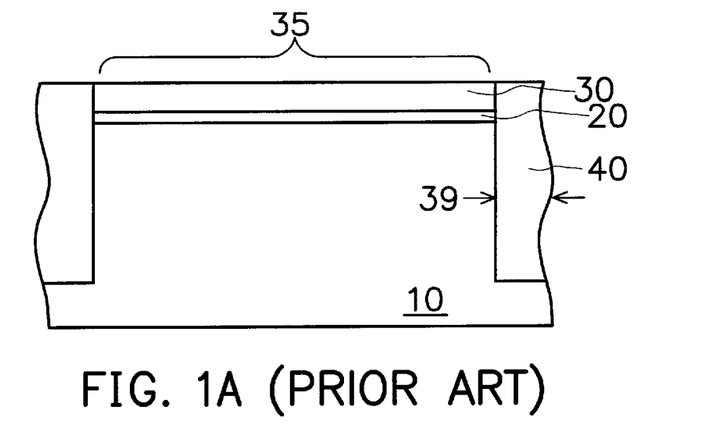
FIGS. 1A–1E are cross-sectional views of a portion of a substrate, schematically illustrating a conventional fabrication process for forming a MOS transistor with a borderless contact.

FIGS. 1A–1E are cross-sectional views of a portion of a substrate, schematically illustrating a conventional fabrication process for forming a transistor with a borderless contact. In FIG. 1A, a pad oxide layer 20 and a silicon nitride layer 30 are sequentially formed over a semiconductor substrate 10. A trench 39 in the substrate 10 is formed by etching the substrate 10. An active area 35 between each trench 39 is simultaneously formed. A shallow trench isolation (STI) structure 40 is formed by filling the trench 39 with insulating material.

Figure 1B:
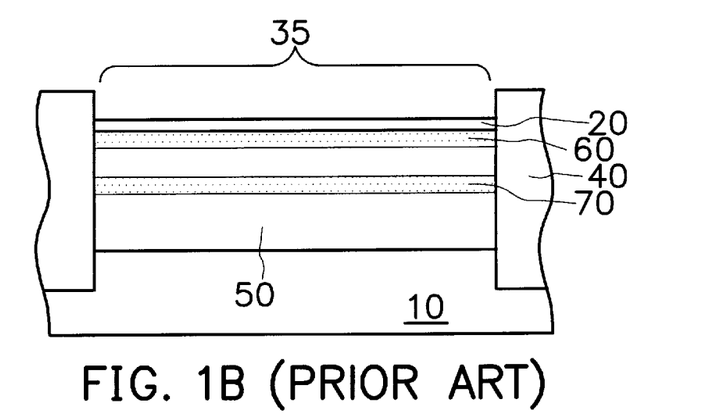

In FIG. 1B, the silicon nitride layer 30 is removed. An ion implantation is performed to dope the substrate 10 on the active area 35 so as to form a well 50. In the well 50, the ion implantation process is continuously performed to form a threshold voltage doped region 60 and an anti-punch-through doped region 70 below the threshold voltage doped region 60.

Figure 1C:
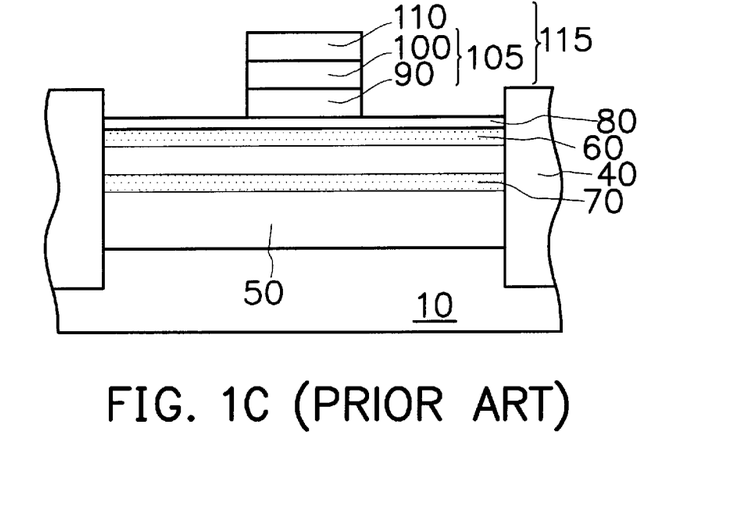

In FIG. 1C, the pad oxide layer 20 is removed. A thermal oxidation process is performed to form a gate oxide layer 80 on the substrate 10. A doped polysilicon layer 90, a tungsten silicide layer 100, and a cap silicon nitride layer 110 are sequentially formed on the pad oxide layer 80 and are patterned to form a gate structure 115 shown in FIG. 1C.

Figure 1D:
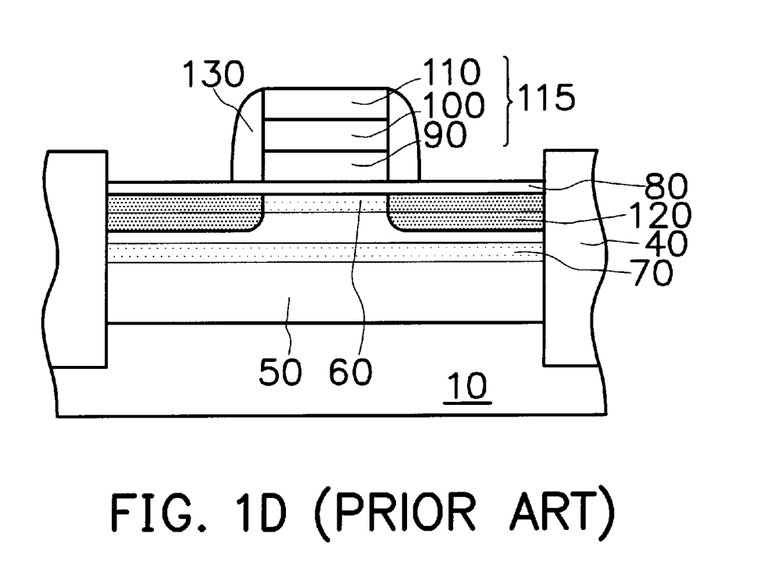

In FIG. 1D, using the gate structure 115 as a mask, an interchangeable source/drain regions 120 is formed by ion implantation in the substrate 10 at each side of the gate structure 115. Two spacers 130 including silicon nitride are respectively formed on each sidewall of the gate structure 115.

Figure 1E:
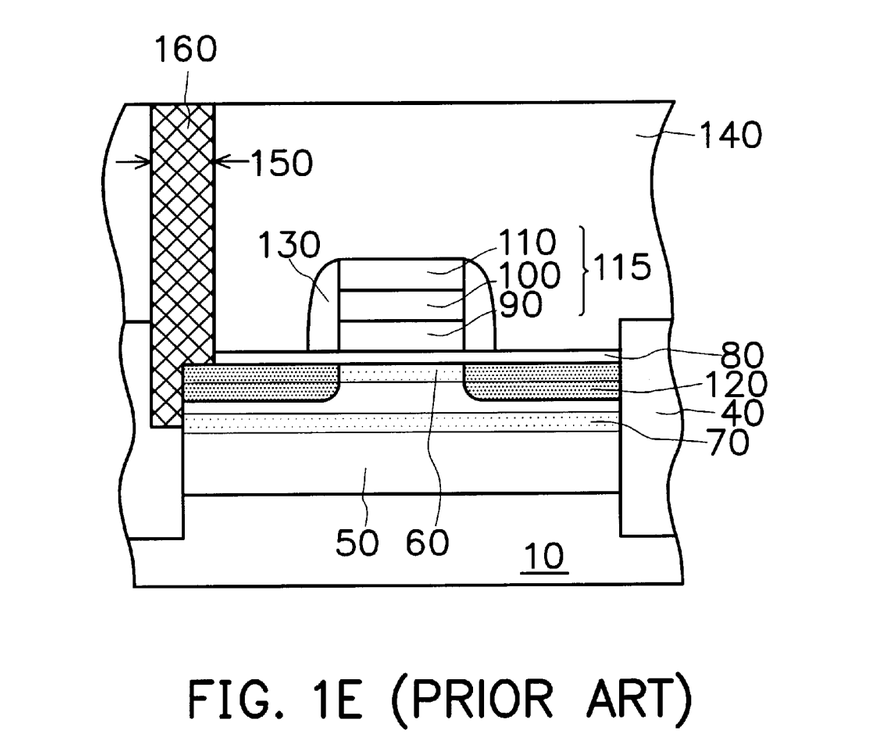

In FIG. 1E, a dielectric layer 140 including silicon oxide is formed over the substrate 10. A contact opening 150 is formed to ideally expose the interchangeable source/drain region 120. Since an unlanded strategy is applied, the borderless contact opening 150 is formed. The borderless contact opening 150 also exposes a portion of the STI structure 40. The borderless contact opening 150 is filled with metallic material to form a contact plug 160, or called a contact 160, which is usually coupled to a bit line.

In this conventional fabrication process, it has several issues as follows:

1. Since the contact 160 in a kind of borderless contact, the contact opening 150 is not precisely formed on the interchangeable source/drain region 120. When an etching process is performed to form the contact opening 150, because the STI structure 40 is also made of silicon oxide, it is also etched during the formation of the contact opening 150. If the etching process is properly controlled, the etching process can easily over-etch the STI structure 40 with a greater depth than the junction depth of the interchangeable source/drain region 120 as shown in FIG. 1E. When the contact 160 is formed, it has an electrical coupling with the substrate 10, resulting in a short circuit of the MOS transistor.

2. The contact open 150 is formed by etching the dielectric layer 140 and the gate oxide layer 80 so that the aspect ratio, which is a ratio of depth to width in an opening, of the contact opening 150 is relatively large. This causes a poor step coverage capability to deposit the contact opening 150 with doped polysilicon.

3. The threshold voltage doped region 60 formed in the well 50 produces an extra series resistance to the interchangeable source/drain region 120. The anti-punch-through doped region 70 is close to the interchangeable source/drain region 120 so that a dopant density around the interchangeable source/drain region 120 is increased. This causes an extra junction capacitance of the interchangeable source/drain region 120.

4. Since the interchangeable source/drain region 120 is formed by ion implantation, a driving-in process is usually necessary to diffuse the implanted ions so as to obtain a uniform ion distribution. The driving-in process may also cause a lateral diffusion so that a short channel effect may easily occur. Moreover, since the ion implantation may also causes a certain degree of damage to the substrate 10, a junction leakage can also occur.

SUMMARY OF THE INVENTION

It is therefore an objective of the present invention to provide a method for fabricating a MOS transistor, using a dummy gate, so as to solve the conventional short circuit issue as mentioned in the first conventional issue.

It is another an objective of the present invention to provide a method for fabricating a MOS transistor, using a dummy gate, so as to solve the conventional large aspect ratio issue as mentioned in the second conventional issue.

It is still another an objective of the present invention to provide a method for fabricating a MOS transistor, using a dummy gate, so as to solve the conventional issues of extra series resistance and extra junction capacitance on the interchangeable source/drain region, as mentioned in the third conventional issue.

It is still another yet an objective of the present invention to provide a method for fabricating a MOS transistor, using a dummy gate, so as to solve the conventional lateral diffusion issue, as mentioned in the fourth conventional issue.

It is still yet another yet an objective of the present invention to provide a method for fabricating a MOS transistor with an improved borderless contact so as to solve the conventional short circuit issue as mentioned in the first conventional issue.

In accordance with the foregoing and other objectives of the present invention, an improved method for fabricating a MOS transistor is provided. The improved method includes forming a dummy gate for each desired transistor on a semiconductor substrate. Typically, at least two transistors are to be formed simultaneously. A doped polysilicon layer including desired dopants is formed on the substrate at each side of the dummy gate. An isolation structure, such as a shallow trench isolation (STI) structure, is formed on the substrate so that an active area is formed between each isolation structure. A horizontal opening is formed on the isolation structure to connect two adjacent dummy gates respectively belonging to two adjacent desired transistors. The dummy gate is removed so that two sidewalls of the doped polysilicon layer is exposed. Using the doped polysilicon layer as a mask, a doped well is formed in the substrate at the location, where is originally covered by the dummy gate.

Two spacers are respectively formed on the sidewalls of the doped polysilicon layer. Using the doped polysilicon layer and the spacers as a mask, a threshold voltage doped region and an anti-punch-through doped region are sequentially formed in the substrate. A gate oxide layer is formed on the exposed substrate between the spacers. An interchangeable source/drain region is formed in the substrate by further diffusing the dopants doped in the doped polysilicon layer into the substrate. A gate layer is formed on the gate oxide layer at the space, which is originally occupied by the dummy gate. A passivation layer is formed over the substrate to cover the active area and the isolation structure. A planarization process is performed to planarize the passivation layer so as to expose the doped polysilicon layer. A dielectric layer is formed on the substrate. A contact opening is formed in the dielectric layer to expose the dope polysilicon, which is electrically coupled to one side of the interchange source/drain region. If the contact opening is formed as a borderless contact, the borderless contact may also expose a portion of the passivation layer on the isolation structure. A contact plug is formed by filling the contact opening with conductive material so that the contact plug is electrically coupled to the interchangeable source/drain region through the doped polysilicon. Moreover, since the horizontal opening between two original adjacent dummy gates is filled with conductive material when the gate layer is formed, the adjacent gate layers are electrically coupled.

In conclusion, the invention allows the issue to be solved by following characteristics:

1. Since the isolation structure is protected by the passivation layer, the borderless contact opening does not cause a damage to the isolation structure.

2. Since the contact plug is formed on the doped polysilicon layer, which serves as an interconnection to the interchangeable source/drain region, the aspect ratio of the contact opening is reduced. This allows the step coverage capability to be increased.

3. Since the threshold voltage doped region and the anti-punch-through doped region are formed only under the gate oxide layer, an extra series resistance and an extra junction capacitance are reduced.

4. Since the interchangeable source/drain region is formed by further diffusing the dopants doped in the doped polysilicon layer into the substrate, there is no effect of lateral diffusion to cause a short channel effect.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

FIGS. 2A–2I are cross-sectional views of a portion of a substrate, schematically illustrating a fabrication process for forming a MOS transistor with a borderless contact, according to a preferred embodiment of the invention.

Figure 2A:
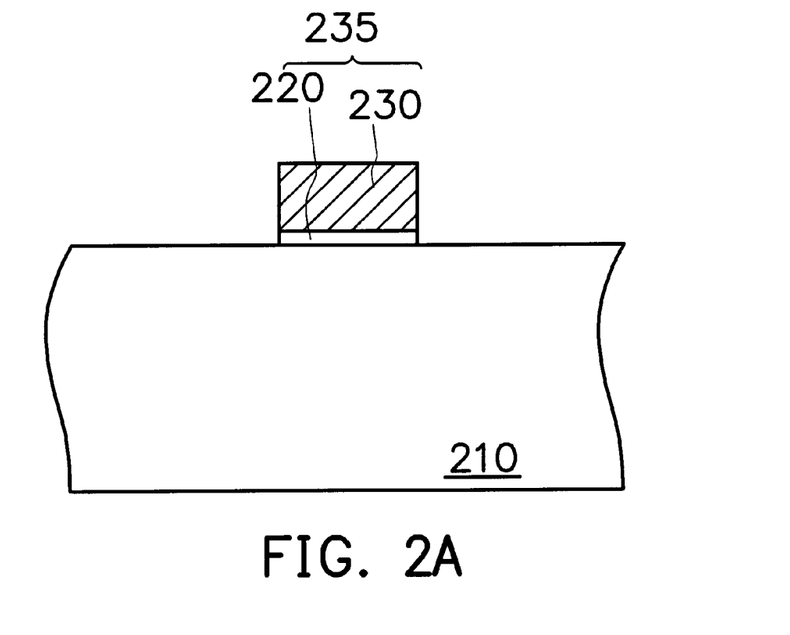
FIGS. 2A–2I are cross-sectional views of a portion of a substrate, schematically illustrating a fabrication process for forming a MOS transistor with a borderless contact, according to a preferred embodiment of the invention.

In FIG. 2A, a dummy gate 235 is formed on a semiconductor substrate 210. The dummy gate 235 includes a pad oxide layer 220 and a silicon nitride layer 230, both of which are patterned as the dummy gate 235. The formation of the pad oxide layer 220 includes, for example, thermal oxidation, and the formation of the silicon nitride layer 230 includes, for example, low pressure chemical vapor deposition (LPCVD).

Figure 2B:
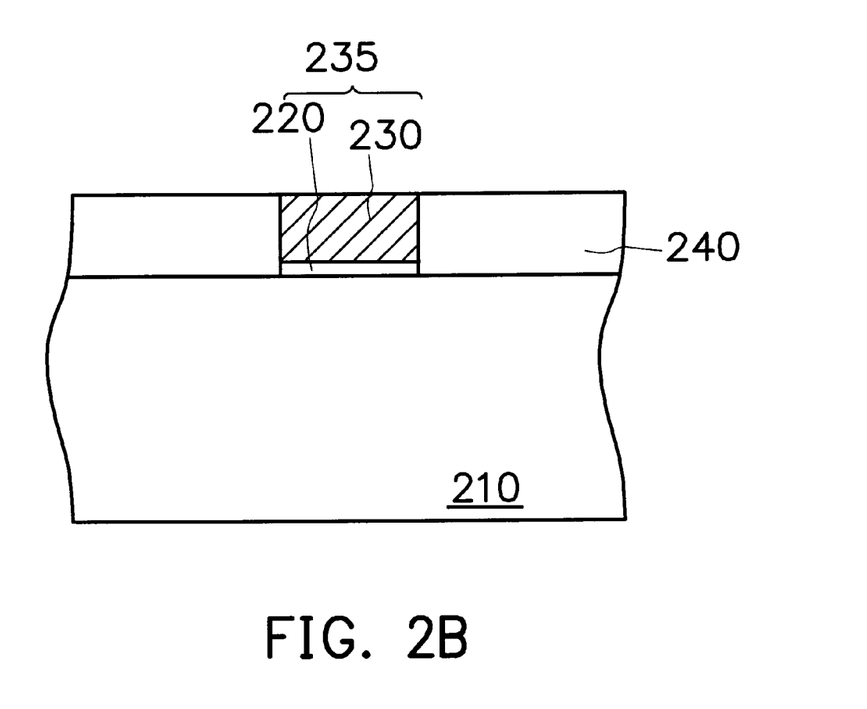
Figure 3:
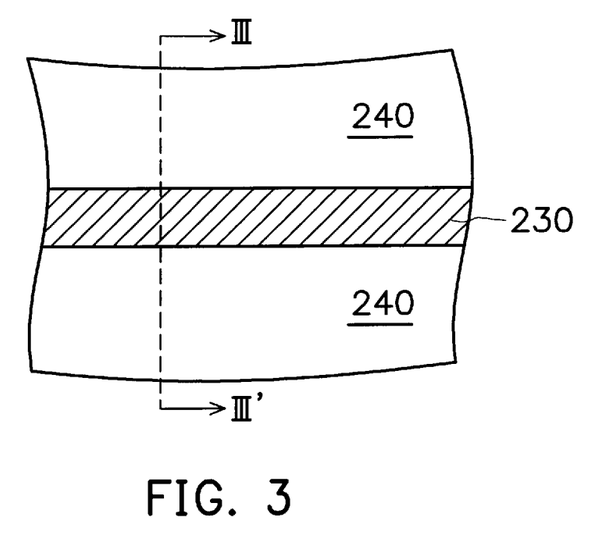
FIG. 3 is a top view of a portion of the substrate, schematically illustrating a fabricating structure of the MOS transistor corresponding to the FIG. 2B, which is the cross-sectional view taken along the line of III-III'.

In FIG. 2B, a doped polysilicon layer 240 is formed on the substrate 210 at each side of the dummy gate 235. A corresponding top view of the current structure of the FIG. 2B is shown in FIG. 3. FIG. 2 is a top view of a portion of the substrate, schematically illustrating a fabricating structure of the MOS transistor corresponding to the FIG. 2B, which is the cross-sectional view taken along the line of III-III'. The formation of the doped polysilicon layer 240 includes forming a preliminary polysilicon layer over the substrate 210, and performing a planarization process, such as chemical mechanical polishing (CMP), to polish the preliminary polysilicon so as to expose the dummy gate 235. A remaining portion of the preliminary polysilicon layer forms the doped polysilicon layer 240.

Figure 2C:
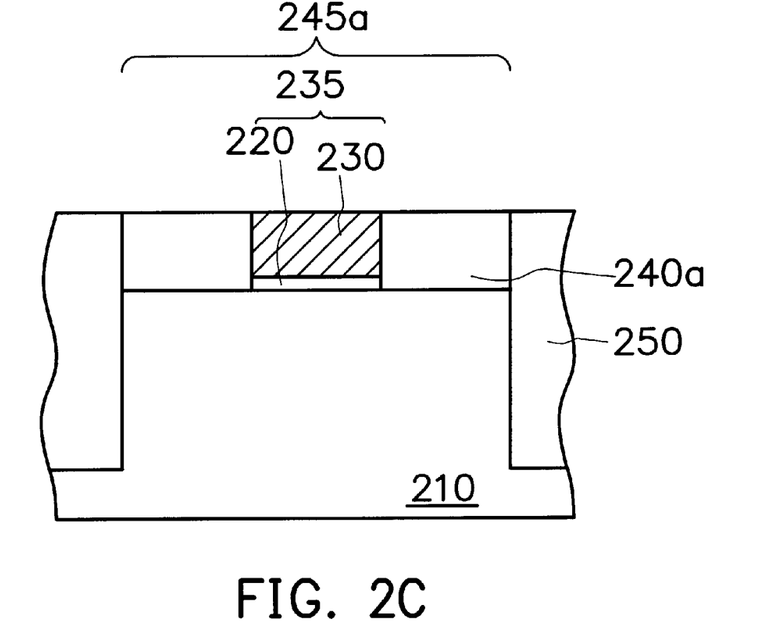
Figure 2D:
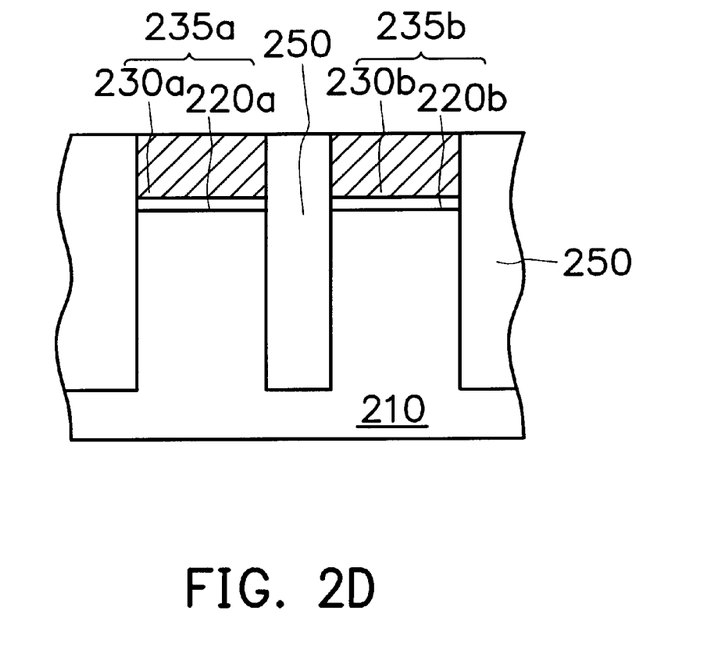
Figure 4:
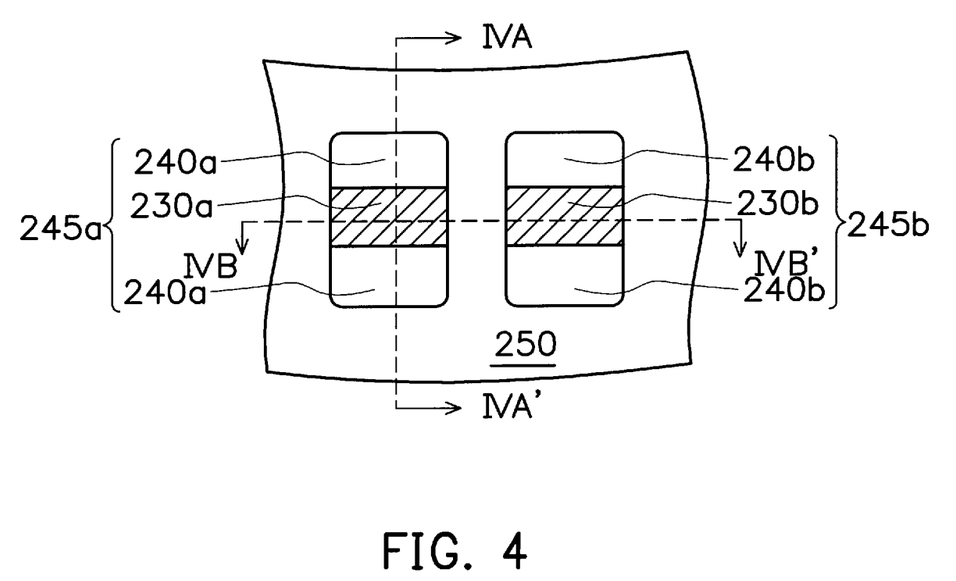
FIG. 4 is a top view of a portion of the substrate, schematically illustrating a fabricating structure of the MOS transistor corresponding to the FIG. 2C and FIG. 2D, in which the FIG. 2C is the cross-sectional view taken along the line of IVA-IVA' and the FIG. 2D is the cross-sectional view taken along the line of IVB-IVB'.

Typically, there are several MOS transistor to be formed on the substrate 210. Each MOS transistor includes one dummy gate 235 at a desired place. Before referring to the FIG. 2C for descriptions of a subsequent process, the FIG. 4 is preferably first referred. FIG. 4 is a top view of a portion of the substrate, schematically illustrating the current fabricating structure of the MOS transistor corresponding to the FIG. 2C and FIG. 2D, in which the FIG. 2C is the cross-sectional view taken along the line of IVA-IVA' and the FIG. 2D is the cross-sectional view taken along the line of IVB-IVB'. In FIG. 4, an isolation structure 250, such as a shallow trench isolation (STI) structure 250 is formed in the substrate 210 so as to define several active regions, such as two adjacent active regions, 245a, 245b shown in FIG. 4 for descriptions. Both active regions, 245a, 245b are identical. The cross-sectional view of the active region 245a along the line IVA-IVA' is shown in FIG. 2C. In FIG. 4 and FIG. 2C, each active region, such as the active region 245a, includes one dummy gate 235a and one doped polysilicon layer 240a on the substrate 210 at each side of the dummy gate 235a. The doped polysilicon layer 240a is originated from the doped polysilicon layer 240 of FIG. 2, and the dummy gate 235a is identical to the dummy gate 235 of FIG. 2B. The STI structure 250 has a planarized surface to form a planar surface over the substrate 210. The formation of the STI structure 250 includes patterning the substrate 210 by, for example, photolithography and etching to form a trench in the substrate 210, and filling the trench with, for example, silicon oxide to form the STI structure 250.

Another cross-section view of the FIG. 4 along the line IVB-IVB' is shown in FIG. 2D. In FIG. 4 and FIG. 2D, the two adjacent dummy gates 235a, 235b are schematically shown. The STI structure 250 also exists between these two adjacent dummy gates 235a, 235b. Each dummy gate, such as the dummy gate 235a includes a silicon nitride layer 230a and a pad oxide layer 220a. Similarly, the dummy gate 235b includes a silicon nitride layer 230b and a pad oxide layer 220b.

Figure 2E:
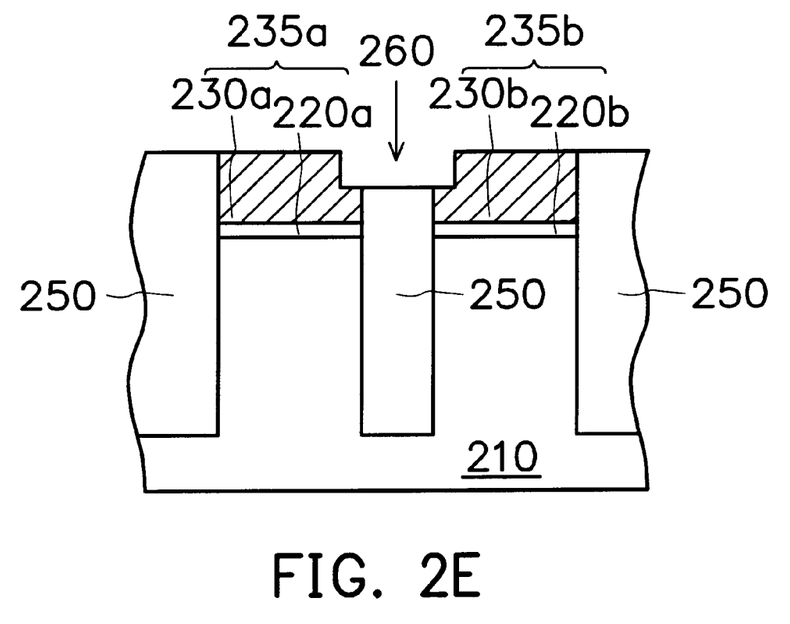
Figure 5:
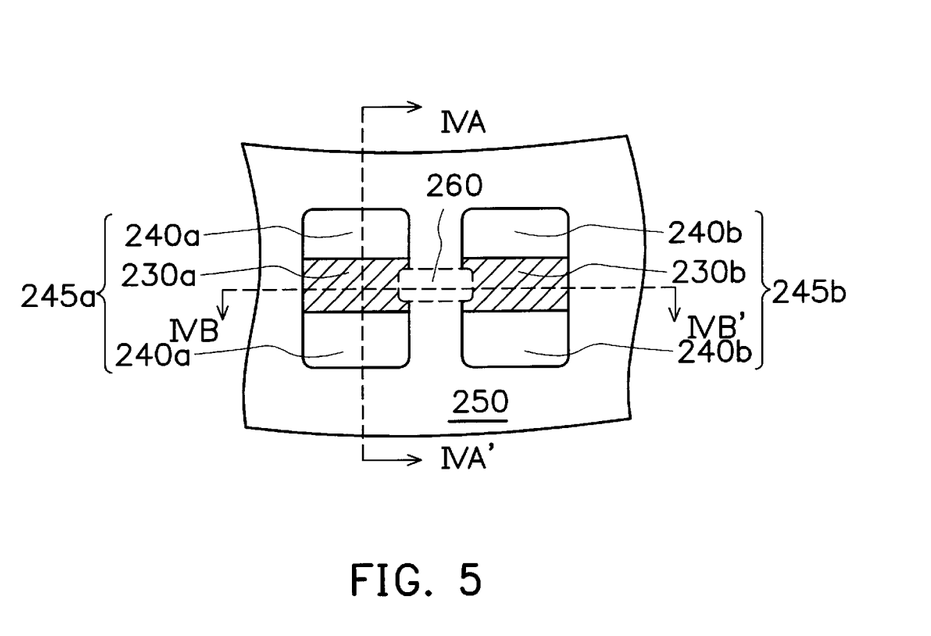
FIG. 5 is a top view of a portion of the substrate, schematically illustrating a fabricating structure of the MOS transistor corresponding to the FIG. 2E, which is the cross-sectional view taken along the line of IVB-IVB'.

In FIG. 2E, an horizontal gate opening 260 is formed by patterning the STI structure and these two adjacent dummy gates 235a, 235b. The patterning process includes, for example, photolithography and etching. The etching process includes, for example, a plasma etching process with a reaction gas, such as $CF_4$. When the horizontal gate opening 260 is filled with conductive material later, these two adjacent dummy gates 235a, 235b are electrically coupled together. The depth of the horizontal gate opening 260 preferably is smaller than the thickness of the adjacent dummy gates 235a, 235b, and the opening length is sufficiently largest to reach the two adjacent dummy gates 235a, 235b. A top view corresponding to the FIG. 2E is schematically shown in FIG. 5. FIG. 5 is a top view of a portion of the substrate, schematically illustrating a fabricating structure of the MOS transistor corresponding to the FIG. 2E, which is the cross-sectional view taken along the line IVB-IVB' in FIG. 5. In FIG. 2E and FIG. 5, the horizontal gate opening 260 is formed to have a coverage range between these two adjacent dummy gates 235a, 235b. In the late fabrication process, the dummy gates 235a, 235b are to be replace by actual gates so that the adjacent gates are electrically coupled through a horizontal gate plug, which fills the horizontal gate opening 260.

Figure 2F:
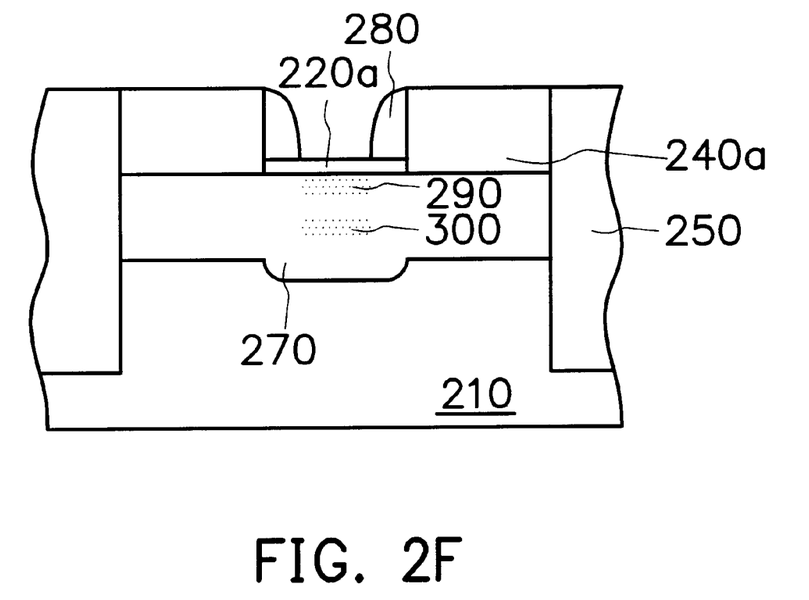

In FIG. 2F, following FIG. 2C taken along the line IVB-IVB' in FIG. 5, the silicon nitride layer 230a is removed. Using the doped polysilicon layer 240a and the STI structure 250 as a mask, an ion implantation process is performed, and an annealing process is performed at a temperature of about 800° C.–1000° C. so as to form a doped well 270 in the substrate 210. Two spacer 280 are formed on each sidewall of the doped polysilicon layer 240a. The formation of the spacers 280 include forming an insulating layer over the substrate, and performing an etching back process to remove the insulating layer. A remaining portion of the insulating layer forms the spacers 280. The spacers 280 includes, for example, silicon nitride. The etching back process include, for example, a plasma etching process with a etchant gas of $CH_3F$, $CHF_3$, or $NF_3$. Using the spacers 280, the doped polysilicon layer 240a, and the STI structure 250 as a mask, a threshold voltage doped region 290 and an anti-punch-through doped region 300 are formed in the doped well 270 below the pad oxide layer 220a by ion implantation. The purpose of the threshold voltage doped region 290 is to adjust the threshold voltage level. The purpose of the anti-punch-through doped region 300 is to prevent a conventional electron punch through phenomenon from occurring. Since the threshold voltage doped region 290 and the anti-punch-though doped region 300 are formed under the pad oxide layer 220a, an extra series resistance and an extra junction capacitance are effectively avoided.

Figure 2G:
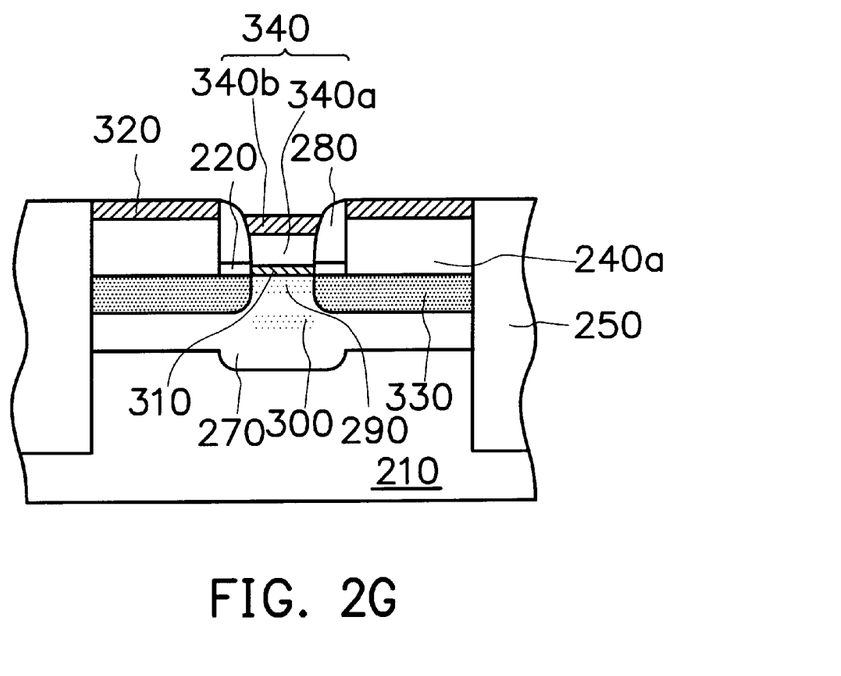

In FIG. 2G, an exposed portion of the pad oxide layer 220a of FIG. 2F, is removed to expose the substrate 210. A thermal oxidation process is performed to form a gate oxide layer 310 on the exposed portion of the substrate 210. The thermal oxidation process includes a temperature of about higher than 900° C. In this thermal oxidation process, a surface of the doped polysilicon layer 240a is also oxidized to form a silicon oxide 320. At this stage, since the substrate 210 has processed by two times of thermal processes that are the annealing process and the thermal oxidation process, dopants doped in the doped polysilicon layer 240a also automatically diffuse into the substrate 210 to form an interchangeable source/drain region 330 at each side of the gate oxide layer 310 in the substrate 210.

Continuously, a gate layer 340 is formed by filling a free space between the spacers 280, in which the free space is originally occupied by the dummy gate 235a of FIG. 2C. The gate layer 340 includes a gate conductive layer 340a, such as a gate doped polysilicon layer, and can also include a self-aligned silicide (Salicide) layer 340b on the gate conductive layer 340a to increase conductivity. The formation of the gate conductive layer 340a includes, for example, forming a preliminary doped polysilicon layer over the substrate 210, and performing an etching back process, using the silicon oxide layer 320 as an etching stop point, to remover the preliminary doped polysilicon layer other than the free space between the spacers 280 so that the silicon oxide layer 320 is exposed again. The preliminary doped polysilicon layer is further over etched to form the gate conductive layer 340a, which therefore has a top surface height lower than that of the doped polysilicon layer 240a. The formation of the Salicide layer 340b includes, for example, forming a metal layer, such as a titanium layer, over the substrate 210, performing a thermal process to trigger a reaction between silicon in the gate conductive layer 340a and the metal layer so as to form the Salicide layer 340b. The remaining metal layer without reaction is removed. Since the doped polysilicon layer is covered by the silicon oxide layer 320, there is no Salicide layer on it.

Moreover, also referring to FIG. 5, during the formation of the gate layer 340, the horizontal gate opening 260 is also filled with the same conductive material so that the gate layer 340 is electrically to an another adjacent gate layer 340 belonging to the active region 245b.

Figure 2H:
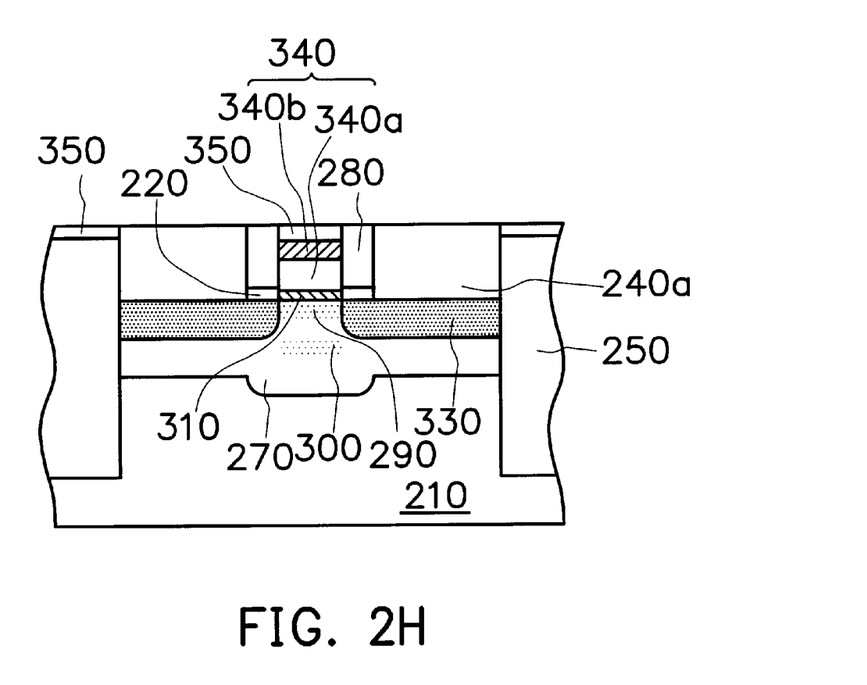

In FIG. 2G and FIG. 2H, an etching back process is performed to remove the silicon oxide layer 320 on the doped polysilicon layer 240a, and a certain top portion of the STI structure 250. A passivation layer 350 is formed over the substrate 210, and is planarized by a planarization process, such as a chemical mechanical polishing (CMP) process. The doped polysilicon layer 240a is exposed again. The spacers 280 are exposed and planarized. A remaining portion of the passivation layer 350 covers the STI structure 250 and the gate layer 340. A planar surface is formed over the substrate 210. Here, even though the gate layer 340 is covered by the passivation layer 350, each gate layer 340 is electrically coupled to each other through the horizontal gate opening 260 of FIG. 2E. The passivation layer 350 preferably includes silicon nitride.

Figure 2I:
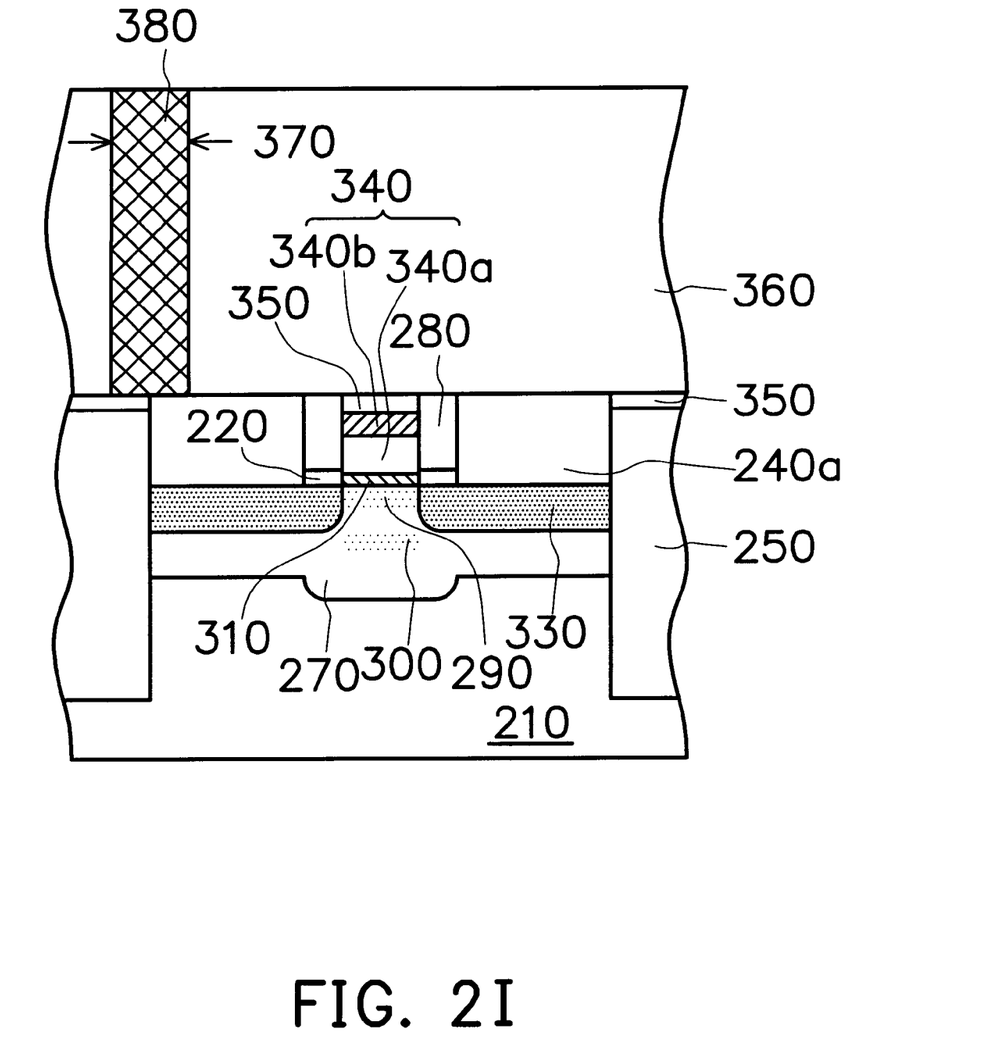

In FIG. 2I, a dielectric layer 360 including, for example, silicon oxide is formed over the substrate 210 through, for example, atmospheric pressure chemical vapor deposition (APCVD). The dielectric layer 360 is patterned to form a contact opening 370, which exposes the substrate 210 on the dope polysilicon layer 240a. Since the contact opening 370 is formed by the borderless contact technology, the contact opening 370 may also expose the passivation layer 350 on the STI structure 250. In this manner, the passivation layer 350 can protect the STI structure 250 from being over etched, resulting in a damage to the STI structure 250.

The contact opening 370 is filled with a conductive material, such as tungsten, or doped polysilicon to form a contact plug 380. The formation of the contact plug 380 includes, for example, depositing a preliminary conductive layer over the substrate by, for example, chemical vapor deposition (CVD) so that the contact opening 370 is also filled. A planarization process is performed to remove the preliminary conductive layer so that a remaining portion of the preliminary conductive layer becomes the contact plug 380 that fills the contact opening 370.

In conclusion, the method of the invention for fabricating a MOS transistor with a borderless contact plug has several characteristics as follows:

1. Since the STI structure 250 is protected by the passivation layer 350 including silicon nitride that is different from silicon oxide of the dielectric layer 360, the borderless contact opening does not cause a damage to the isolation structure if an unlanded contact opening occurs.

2. Since the contact plug 260 is formed on the doped polysilicon layer 240a, which serves as an interconnection to the interchangeable source/drain region 330, the aspect ratio of the contact opening 370 is reduced by an amount of the thickness of the doped polysilicon layer 240a. This allows the step coverage capability to be increased.

3. Since the threshold voltage doped region 290 and the anti-punch-through doped region 300 are formed only under the gate oxide layer 310, the total dopant density around the interchangeable source/drain region 330 is effectively reduced. An extra series resistance and an extra junction capacitance are effectively reduced.

4. Since the interchangeable source/drain region 330 is formed by further diffusing the dopants doped in the doped polysilicon player into the substrate 210 through thermal processes, there is no lateral diffusion phenomenon to cause a short channel effect.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a transistor on a substrate having a pad oxide layer and a silicon nitride layer sequentially formed on the substrate, the method comprising:

patterning the pad oxide layer and the silicon nitride layer to form a plurality of dummy gate structures on the substrate;

forming a doped polysilicon layer over the substrate;

performing a planarization process to planarize the doped polysilicon layer so as to expose the dummy gate structures;

forming an isolation structure in the substrate and the doped polysilicon layer to isolate each of the dummy gate structures so as to form a plurality of active areas, each of the active areas comprises one of the dummy gate structures;

patterning the isolation structure to form a horizontal opening, which extends from one of the dummy gate structures to an adjacent one of the dummy gate structures;

removing the silicon nitride layer so that a plurality of sidewalls of the doped polysilicon layer are exposed, and the pad oxide layer is also exposed;

forming a doped well in the substrate by ion implantation, using the isolation structure and the doped polysilicon layer as a mask;

forming a plurality of spacers respectively on each of the sidewalls of the doped polysilicon;

forming a threshold voltage doped region and an anti-punch-through doped region in the doped well within a region between the spacers;

removing the exposed pad oxide layer so as to expose a portion of the substrate;

forming a gate oxide layer on the exposed portion of the substrate, and simultaneously forming an interchangeable source/drain region in the substrate covered by the doped polysilicon layer, wherein a silicon oxide is also simultaneously formed on the doped polysilicon layer;

forming a gate doped polysilicon layer over the substrate so that a free space between the spacers and the horizontal opening on the isolation structure are also filled;

performing an etching back process on the gate doped polysilicon layer to expose the silicon oxide layer and the isolation structure, wherein the etching back process further over-etches the gate doped polysilicon layer so as to have a top surface height lower than a top surface of the doped polysilicon layer;

forming a self-aligned silicide (Salicide) layer on the gate doped polysilicon layer;

removing the silicon oxide layer and a top portion of the isolation structure;

forming a passivation layer over the substrate; and performing a planarization process over the substrate to planarize the passivation layer so as to expose the doped polysilicon layer and the spacers, in which a remaining portion of the passivation layer covers the isolation structure and the Salicide layer.

2. The method of claim 1, wherein the method further comprises:

forming a dielectric layer over the substrate;

patterning the dielectric layer to form a borderless contact opening to expose the doped polysilicon layer, and the passivation layer on the isolation structure of an unlanded contact opening is formed; and filling the borderless contact opening with conductive material.

3. The method of claim 2, wherein the dielectric layer comprises silicon oxide.

4. The method of claim 1, wherein the passivation layer comprises silicon nitride.

5. The method of claim 1, wherein the step of performing a planarization process over the substrate to planarize the passivation layer comprises chemical mechanical polishing (CMP).

6. The method of claim 1, wherein the spacers comprises silicon nitride.

7. The method of claim 1, wherein the isolation structure comprises a shallow trench isolation (STI) structure.

8. The method of claim 1, wherein the step of forming the doped well comprises an annealing process, which induces a first diffusion of dopants doped into the doped polysilicon layer into the substrate.

9. The method of claim 8, wherein the annealing process comprises a temperature of about 800° C.–1000° C.

10. The method of claim 1, wherein the step of forming the gate oxide layer comprises a thermal oxidation process, which induces a second diffusion of dopants doped into the doped polysilicon layer into the substrate to form the interchangeable source/drain region.

11. The method of claim 10, wherein the thermal oxidation process comprises a temperature of about greater than 900° C.

12. The method of claim 1, wherein the step of forming the threshold voltage doped region and the anti-punch-through doped region in the doped well comprises ion implantation.

13. The method of the of claim 1, wherein the step of forming the Salicide layer comprises:

forming a metal layer over the substrate;

performing a thermal process to trigger a reaction between silicon in the doped polysilicon layer and the metal layer so as to form the Salicide layer; and remaining the metal layer without reaction.

14. The method of the of claim 1, wherein in the step of patterning the isolation structure to form the horizontal opening, the horizontal opening has a depth shallower than the dummy gate structures.

15. A method for fabricating a transistor on a substrate, the method comprising:

forming a plurality of dummy gate structures on the substrate and the substrate other than the dummy gates are exposed, wherein each of the dummy gate structure comprises a pad oxide layer and a hard layer sequentially formed on the substrate;

forming a doped polysilicon layer on the exposed substrate with a thickness equal to a thickness of the dummy gate;

forming an isolation structure in the substrate and the doped polysilicon layer to isolate each of the dummy gate structures so as to form a plurality of active areas, each of the active areas comprises one of the dummy gate structures;

patterning the isolation structure to form a horizontal opening, which extends from one of the dummy gate structures to an adjacent one of the dummy gate structures;

removing each hard layer of the dummy gate structures so that a plurality of sidewalls of the doped polysilicon layer are exposed, and each pad oxide layer of the dummy gate structures are also exposed;

forming a doped well in the substrate, using the isolation structure and the doped polysilicon layer as a doping mask;

forming a plurality of spacers respectively on each of the sidewalls of the doped polysilicon;

forming a threshold voltage doped region and an anti-punch-through doped region in the doped well, using the spacers, the doped polysilicon layer, and the isolation structure as a doping mask;

removing the exposed pad oxide layer so as to expose a portion of the substrate;

forming a gate oxide layer on the exposed portion of the substrate, and simultaneously forming an interchangeable source/drain region in the substrate covered by the doped polysilicon layer, wherein a silicon oxide is also simultaneously formed on the doped polysilicon layer;

forming a gate conductive layer over the substrate, wherein a free space between the spacers and the horizontal opening on the isolation structure are also filled;

performing an etching back process on the gate conductive layer to expose the silicon oxide layer and the isolation structure, wherein the etching back process further over-etches the gate conductive layer so as to have a top surface height lower than a top surface of the doped polysilicon layer;

removing the silicon oxide layer and a top portion of the isolation structure;

forming a passivation layer over the substrate; and performing a planarization process over the substrate to planarize the passivation layer so as to expose the doped polysilicon layer and the spacers, in which a remaining portion of the passivation layer covers the isolation structure and the gate conductive layer.

16. The method of claim 15, wherein the method further comprises:

forming a dielectric layer over the substrate;

patterning the dielectric layer to form a borderless contact opening to expose the doped polysilicon layer, and the passivation layer on the isolation structure if an unlanded contact opening is formed; and filling the borderless contact opening with conductive material.

17. The method of claim 1, wherein the passivation layer comprises silicon nitride.

18. The method of claim 1, wherein the isolation structure comprises a shallow trench isolation (STI) structure.

19. The method of claim 1, wherein the step of forming the doped well comprises an annealing process, which induces a first diffusion of dopants doped into the doped polysilicon layer into the substrate.

20. The method of claim 1, wherein the step of forming the gate oxide layer comprises a thermal oxidation process, which induces a second diffusion of dopants doped into the doped polysilicon layer into the substrate to form the interchangeable source/drain region.

* * * * *